United States Patent

Aihara et al.

[11] Patent Number: 6,120,571
[45] Date of Patent: Sep. 19, 2000

[54] POLISHING AGENT FOR SEMICONDUCTOR AND METHOD FOR ITS PRODUCTION

[75] Inventors: Ryohei Aihara; Kazuaki Endoh; Katsuyuki Tsugita, all of Chigasaki, Japan

[73] Assignee: Seimi Chemical Co., Ltd., Chigasaki, Japan

[21] Appl. No.: 09/061,059

[22] Filed: Apr. 16, 1998

[30] Foreign Application Priority Data

Apr. 28, 1997 [JP] Japan ................................. 9-111084

[51] Int. Cl.$^7$ .............................. C09K 3/14; C09C 1/68; C09G 1/02
[52] U.S. Cl. .................. 51/309; 51/307; 106/3; 438/693; 423/263
[58] Field of Search ............... 51/309, 293, 307; 106/3; 438/692, 693; 423/263

[56] References Cited

U.S. PATENT DOCUMENTS

| | | | |
|---|---|---|---|
| 3,429,080 | 2/1969 | Lachapelle . | |
| 5,011,671 | 4/1991 | Le Loarer | 423/592 |
| 5,389,352 | 2/1995 | Wang | 106/3 |
| 5,468,682 | 11/1995 | Homma . | |
| 5,543,126 | 8/1996 | Ota et al. | 423/263 |
| 5,597,341 | 1/1997 | Kodera et al. . | |
| 5,697,992 | 12/1997 | Ueda et al. | 51/307 |
| 5,766,279 | 6/1998 | Ueda et al. | 51/309 |

FOREIGN PATENT DOCUMENTS

| | | |
|---|---|---|
| 0 266 233 | 5/1988 | European Pat. Off. . |
| 0 820 092 | 1/1998 | European Pat. Off. . |
| 2 583 034 | 12/1986 | France . |

OTHER PUBLICATIONS

Patent Abstracts of Japan, vol. 096, No. 009, Sep. 30, 1996, JP 08 134435, May 28, 1996.

*Primary Examiner*—Michael Marcheschi
*Attorney, Agent, or Firm*—Oblon, Spivak, McClelland, Maier & Neustadt, P.C.

[57] ABSTRACT

A polishing agent for semiconductor, comprising cerium oxide particles having a weight average particle size of from 0.1 to 0.35 $\mu$m and a crystallite size of from 150 to 600 Å.

9 Claims, No Drawings

POLISHING AGENT FOR SEMICONDUCTOR AND METHOD FOR ITS PRODUCTION

The present invention relates to a polishing agent for semiconductor comprising a cerium oxide powder or an aqueous suspension thereof, and a method for producing such a polishing agent for semiconductor. More particularly, it relates to a polishing agent for semiconductor suitable for polishing e.g. a silicon oxide interlaminar insulating film in a process for producing semiconductor devices, and a method for producing such a polishing agent for semiconductor.

Heretofore, CMP (Chemical Mechanical Polishing) has been employed for polishing and planarizing e.g. a silicon oxide interlaminar insulating film in a process for producing semiconductor devices, and colloidal silica has been commonly used (Journal of Electrochemical Society, 1991, vol. 138, 1778–1784). Colloidal silica is used usually in a state wherein silica particles having a particle size of a few tens nm are suspended in water, and KOH or NaOH is usually added for the purpose of increasing the polishing speed and adjusting the hydrogen ion concentration to secure dispersion stability.

However, there has been a problem that if a polishing agent containing such an alkali metal is used for polishing e.g. a silicon oxide film, the alkali metal in the polishing agent is likely to diffuse into a silicon oxide film, and in a MOS device, it tends to change the threshold voltage thereby to substantially lower the reliability. On the other hand, there is a polishing agent having the hydrogen ion concentration adjusted by ammonia or amine so that no or little alkali metal is contained in the suspension of colloidal silica particles. However, such a polishing agent has had problems such that the dispersion is not stable, and the polishing speed of e.g. a silicon oxide film is so slow that it is not practically useful.

In order to solve these problems, cerium oxide has been proposed as a polishing agent. Cerium oxide provides a high polishing speed, but it has had practical problems such that scratches are observed on the insulating film surface after polishing, and a substantial amount of an alkali metal remains in the insulating film.

Accordingly, when cerium oxide is used as a polishing agent for a process for producing semiconductor devices, it is desired to provide cerium oxide whereby scratches are scarcely observable on the insulating film surface of a semiconductor wafer after polishing, and the polishing speed will not be lowered. It is an object of the present invention to provide a cerium oxide type polishing agent for semiconductor, which brings about little scratches on the polished insulating film surface of a semiconductor wafer. Another object of the present invention is to provide a cerium oxide type polishing agent for semiconductor, whereby the amount of an alkali metal such as sodium remaining in the polished insulating film of a semiconductor wafer, is little.

Further, it is common that a cerium oxide powder is used for a polishing process in the form of an aqueous suspension as suspended in water. According to the research by the present inventors, it has been found that if microorganisms, particularly bacteria of genus Pseudomonas, are present in this suspension, it is difficult to remove them from the surface after polishing, and dead bacteria is likely to cause a trouble, such as short circuiting the wirings. This is a serious problem, since a line width and a line-to-line space tends to be increasingly narrow along with a progress in high densification of a semiconductor circuit, and it has been required that even a slight residue should not remain on the surface after polishing. To cope with this problem, it is conceivable to preliminarily sterilize water to be used for suspending the cerium oxide powder, or to remove dead bacteria with a filter before the aqueous suspension is used as a polishing agent. However, it has been found that even if such sterilized water is used, bacteria are likely to grow during the storage of the suspension for a long period of time, thus leading to the same trouble.

Accordingly, another object of the present invention is to provide a polishing agent for semiconductor consisting of an aqueous suspension of cerium oxide which is free from growth of microorganisms even when stored for a long period of time and which is useful for polishing an insulating film of a semiconductor wafer.

The invention provides a polishing agent for semiconductor, comprising cerium oxide particles having a weight average particle size of from 0.1 to 0.35 $\mu$m and a crystallite size of from 150 to 600 Å.

Further, the present invention provides a method for producing a polishing agent for semiconductor as defined above, wherein cerium carbonate is wet-pulverized, dried and then calcined at a temperature of from 600 to 800° C.

Now, the cerium oxide powder for polishing semiconductor and an aqueous suspension thereof according to the present invention, and a method for producing the polishing agent for semiconductor according to the present invention, will be described.

When polishing is carried out in a process for producing semiconductor devices or the like, various factors may be mentioned as causes for scratches on the surface of an insulating film after polishing, including polishing conditions such as the polishing apparatus, the polishing pressure, the rotational speed, the concentration of the polishing agent and the amount of the slurry of the polishing agent supplied, the particle sizes of the polishing agent, such as the average particle size and the maximum particle size, the hardness of the particles of the polishing agent, and the polishing pad. With a cerium oxide polishing agent, the polishing speed is high as compared with e.g. colloidal silica, but there is a problem that the surface after polishing is likely to have scratches To reduce scratches, it is conceivable to reduce the size of cerium oxide particles. However, according to a research by the present inventors, it is not possible to prevent formation of scratches simply by controlling the particle size, and it has been found essential to control the crystallite size of cerium oxide simultaneously.

The particles of cerium oxide constituting the polishing agent of the present invention have a weight average particle size of from 0.1 to 0.35 $\mu$m, preferably from 0.2 to 0.3 $\mu$m, and a crystallite size of from 150 to 600 Å, preferably from 300 to 500 Å. If the particle size or the crystallite size is larger than the above range, the insulating film surface of a semiconductor device after polishing is likely to have scratches. On the other hand, if the particle size or the crystallite size is smaller than the above range, the polishing speed tends to be low, such being undesirable. The specific surface area of the cerium oxide particles substantially relates to the crystallite size. In the case of the present invention, the specific surface area (by a BET method) is preferably from 9 to 55 $m^2/g$, more preferably from 15 to 30 $m^2/g$.

In the present invention, the weight average particle size is determined in such a manner that the particle size distribution is obtained on the mass basis, and a cumulative curve is obtained with the total mass being 100%, whereby the particle size at a point corresponding to 50% of the cumulative curve, is taken as the weight average particle size. It is called also as a mass basis cumulative 50% size. (See e.g. Kirk-Othmer "Encyclopedia of Chemical Technology" Third Edition vol. 21 .106–113 (Wiley-Interscience)). For the measurement of the particle size, the particles are dispersed in a medium such as water by e.g. ultrasonic treatment, and the particle size distribution is measured.

On the other hand, the crystallite size is the size of a crystallite obtained from the X-ray diffraction and is a value calculated by the formula of Sherrer. (See, e.g. B. D. CULLITY "Elements of X-ray Diffraction, 2nd Ed" 1978, Addison-Wesley, Reading, Mass.).

The insulating film after polishing is required not only to be free from scratches but also to contain a less amount of residual alkali metal such as Na or K. In the case of the polishing agent of the present invention, the content of sodium contained in the cerium oxide particles is preferably controlled to be not higher than 10 ppm, preferably not higher than 7 ppm, more preferably not higher than 5 ppm, whereby the problem of the amount of an alkali metal contained in the insulating film after polishing, can be remarkably reduced.

The above-described cerium oxide powder is suspended in an aqueous medium such as water so that the content would be from 0.1 to 20 wt % ((cerium oxide/cerium oxide+water)×100), preferably from 1 to 5 wt %, and used as an aqueous suspension.

To maintain the stability and dispersibility of the cerium oxide powder in the suspension, a water-soluble organic polymer, a cationic surfactant or a nonionic surfactant, may, for example, be added to the aqueous suspension. For example, water-soluble organic polymers such as polyvinyl alcohol, an acrylic acid polymer and its ammonium salt, a methacrylic acid polymer and its ammonium salt, cationic surfactants such as ammonium oleate, ammonium lauryl sulfate and lauryl sulfate triethanolamine, and nonionic surfactants such as polyoxyethylene lauryl ether, polyoxyethylene sorbitan monolaurate and polyethylene glycol distearate, may be mentioned.

With the above-mentioned aqueous suspension, even if sterilized water is used, bacteria may sometimes grow if the suspension is stored for a long period of time, thus leading to a problem. According to the present invention, it has been found possible to prevent growth of bacteria by carrying out sterilization treatment after suspending the cerium oxide powder in water and thereby to prevent the problem even if the suspension is stored for a long period of time. As a method for the sterilization treatment, ultraviolet irradiation, preferably a high temperature heat treatment at a temperature of from 40 to 100° C., particularly from 60 to 80° C., is suitable.

Various methods may be employed for the production of the cerium oxide powder of the present invention having the above-mentioned properties. For example, as a method for producing cerium oxide having a small particle size, a method may be employed wherein an alkali such as NaOH is added to an aqueous ammonium Cerium(IV) nitrate to form a cerium hydroxide gel, followed by filtration, washing and calcining to obtain a cerium oxide powder. However, in such a case, it may take time for the filtration of the gel, or it may not be easy to remove the alkali used. The present inventors have found it industrially advantageous to preliminarily prepare cerium carbonate of high purity and to subject it to wet pulverization, drying and calcining in an oxygen containing gas such as air. The purity of the high purity cerium carbonate is desired to be at least 99%, preferably at least 99.95%. There is no particular restriction as to the method for wet pulverization. However, in order to avoid contamination with a metal from e.g. the pulverization apparatus, it is preferred to employ an agitation mill for a wet system medium employing $ZrO_2$ material at the portion which will be in contact with the liquid. The drying is carried out preferably at a temperature of from 100 to 130° C. for from 4 to 10 hours. The calcining temperature is preferably from 600 to 800° C., more preferably from 650 to 750° C., to control the crystallite size of cerium oxide to be formed. When water is used as the medium for the wet pulverization, aggregation is likely to take place during the drying. Accordingly, depending upon the case, it may be substituted by a non-aqueous solvent such as alcohol, preferably methanol, before drying. Otherwise, a method may be employed wherein pulverization is carried out in a non-aqueous solvent. In a case where coarse particles are contained in the powder after calcination, a crushing or pulverization step may be adopted. Further, classification may be carried out, and in such a case, wet classification is preferred. As a classification type, water screening or mechanical classification may be employed.

The polishing agent of the present invention is useful for polishing an insulating film formed on a semiconductor substrate to remove a part thereof in a process for producing a semiconductor device, as disclosed in JP-A-5-326469 (U.S. Pat. No. 5,597,341) or JP-A-7-173456 (U.S. Pat. No. 5,468,682). For the method of polishing the insulating film with the polishing agent of the present invention, a conventional means and apparatus may be used to remove from a few hundreds to few thousands nm of the insulating film.

Now, the present invention will be described in further detail with reference to Examples. However, it should be understood that the present invention is by no means restricted to such specific Examples.

EXAMPLE 1

High purity cerium carbonate (purity calculated as $CeO_2$: 99.95%, the same applies hereinafter) was suspended in water, pulverized by an agitation mill for a wet system medium, dried and then calcined in an electric furnace at 700° C. for 4 hours. The calcined product was pulverized to obtain a cerium oxide powder (crystallite size: 370 Å, specific surface area: 20.3 $m^2/g$). Each of cerium oxide powders of various particle sizes, thus obtained, was suspended in water in a concentration of 1 wt %, to obtain a polishing fluid. The polishing test was carried out by polishing a 6 inch wafer having a silicon oxide film formed in a thickness of 1 μm on a silicon substrate surface, by means of a polishing cloth at 100 rpm under a pressure of 30 kPa. The test results are shown in Table 1. In each case, the polishing speed was fully satisfactory.

TABLE 1

| Run No. | Weight average particle size (μm) | Number of scratches* |
| --- | --- | --- |
| 1 | 0.51 | 90 |
| 2 | 0.40 | 60 |
| 3 | 0.35 | 5 |
| 4 | 0.33 | 3 |
| 5 | 0.28 | 1 |
| 6 | 0.20 | 1 |
| 7 | 0.18 | 1 |

*Number per 10 $cm^2$ of wafer (as observed by a differential interference microscope)

The particle size of cerium oxide was evaluated by the weight average particle size (by the measurement of the particle size distribution by Microtrack HRA X-100, manufactured by Nikkiso Co., Ltd., the same applies hereinafter).

EXAMPLE 2

Cerium oxide powders as polishing agents, were prepared at different calcining temperatures, and then the polishing tests of insulating films were carried out.

The high purity cerium carbonate was suspended in water, pulverized by an agitation mill for a wet system medium, dried and then calcined in an electric furnace at a temperature of 850° C., 800° C. or 700° C. for 4 hours. Each calcined product was pulverized to obtain a cerium oxide powder having a weight average particle size of 0.28 μm. Each powder was suspended in water at a concentration of 1 wt %, to obtain a polishing fluid. The polishing test was carried out in the same manner as in Example 1. The results are shown in Table 2.

TABLE 2

| Run No. | Calcining temperature | Crystallite size | Specific surface area | Number of scratches* |
|---|---|---|---|---|
| 1 | 850 | 720 | 8.5 | 30 |
| 2 | 800 | 586 | 10.5 | 8 |
| 3 | 700 | 370 | 20.2 | 1 |

*Number per 10 cm² of wafer (as observed by a differential interference microscope)

EXAMPLE 3

Cerium oxide powders were prepared by using high purity cerium carbonates having different Na contents, and the polishing tests were carried out.

High purity cerium carbonates having different Na contents were, respectively, suspended in water, pulverized by an agitation mill for a wet system medium, dried and then calcined in an electric furnace at 700° C. for 4 hours. Each calcined product was pulverized to obtain a cerium oxide powder having a weight average particle size of 0.28 μm (crystallite size: 370 Å, specific surface area: 20.3 m²/g). Each powder was suspended in water at a concentration of 1 wt %, and used as a polishing fluid. The polishing test was carried out in the same manner as in Example 1. The results of measuring the amount of Na remaining in the wafer washed after polishing, are shown in Table 3.

TABLE 3

| Run No. | Type of starting material cerium carbonate | Content (ppm) of Na in cerium oxide | Na after polishing and washing (×10¹⁰ atoms/cm³) |
|---|---|---|---|
| 1 | A | 50 | 10 |
| 2 | B | 30 | 5 |
| 3 | C | 10 | 2 |
| 4 | D | 5 | 1 |

EXAMPLE 4

The cerium oxide powder used in Run No. 2 as shown in Table 1, was suspended in water at a concentration of 10 wt %. The water was preliminarily treated with an ion exchange resin and sterilized by ultraviolet ray irradiation, and then passed through cartridge filters having pore sizes of 1 and 0.1 μm. After preparation of the suspension, the suspension was put in a 10 liter polyethylene container, and subjected to viable cell remaining tests i.e. (A) by leaving it at room temperature, (B) by subjecting it to heat treatment at 60° C. for 1 hour after the preparation and then leaving it at room temperature, and (C) by leaving it at room temperature for 1 day after the preparation, then subjecting it to heat treatment at 60° C. for 1 hour and then leaving it at room temperature. The data obtained by observation of the viable cell number are shown in Table 4.

TABLE 4

| Samples | A Left at room temperature | B Heat-treated and then left at room temperature | C Left at room temperature for 1 day, then heat-treated and left at room temperature |
|---|---|---|---|
| Number of days | Viable cell number* | Viable cell number* | Viable cell number* |
| 1st day | 10 | 0 | 0 |
| 1 day later | 10 | 0 | 0 |
| 3 days later | 250 | 0 | 0 |
| 7 days later | 380 | 0 | 0 |
| 14 days later | 470 | 0 | 0 |
| 30 days later | 2,000 | 0 | 0 |

*Viable cell number: number/ml

As described in the foregoing, the present invention presents a polishing agent for semiconductor containing cerium oxide, which is capable of reducing scratches on the surface of an insulating film of a semiconductor wafer thereby polished and which provides a sufficiently high polishing speed. Further, according to the present invention, it is possible to obtain a cerium oxide aqueous suspension as a polishing agent for a semiconductor, which is capable of reducing the amount of sodium remaining in an insulating film of a semiconductor wafer thereby polished and which is free from growth of microorganisms even when it is stored for a long period of time.

What is claimed is:

1. A polishing agent for semiconductor, comprising cerium oxide particles having a weight average particle size of from 0.2 to 0.3 μm, a crystallite size of from 300 to 500 Å, and a specific surface area of from 15 to 30 m²/g.

2. The polishing agent for semiconductor according to claim 1, wherein sodium present as an impurity in the cerium oxide particles is not more than 10 ppm.

3. A polishing agent for semiconductor, comprising a suspension of cerium oxide particles having a weight average particle size of from 0.2 to 0.3 μm, a crystallite size of from 300 to 500 Å, and a specific surface area of from 15 to 30 m²/g suspended in water at a concentration of from 0.1 to 20 wt %.

4. The polishing agent for semiconductor according to claim 3, wherein sodium present as an impurity in the cerium oxide particles is not more than 10 ppm.

5. The polishing agent for semiconductor according to claim 3, wherein the suspension has been sterilized.

6. A method for removing at least a part of an insulating film formed on a semiconductor substrate, comprising polishing said insulating film with a polishing agent according to claim 1.

7. A method for producing a polishing agent for semiconductor as defined in claim 1, wherein cerium carbonate is wet-pulverized, dried and then calcined at a temperature of from 600 to 800° C.

8. The method for producing a polishing agent for semiconductor according to claim 7, wherein the wet pulverization is carried out in a non-aqueous solvent.

9. The polishing agent for semiconductor according to claim 3, consisting essentially of the defined components.

* * * * *